United States Patent [19]

Lang

[11] Patent Number: 5,831,464
[45] Date of Patent: Nov. 3, 1998

[54] SIMPLIFIED DIFFERENTIAL SINGLE-SHOT

[75] Inventor: Kirk W. Lang, Williston, Vt.

[73] Assignee: International Business Machines Corporation, Armonk, N.Y.

[21] Appl. No.: 641,062

[22] Filed: Apr. 29, 1996

[51] Int. Cl.⁶ .................................................. H03K 3/033
[52] U.S. Cl. ........................................... 327/229; 327/293
[58] Field of Search .................................... 327/166, 170, 327/172–176, 178, 227, 229, 291, 293; 326/98, 104, 106, 108, 112, 119

[56] References Cited

U.S. PATENT DOCUMENTS

| 4,047,057 | 9/1977 | Ahmed | 327/227 |
| 4,314,164 | 2/1982 | Tin et al. | 327/227 |
| 4,829,258 | 5/1989 | Volk et al. | 327/227 |
| 5,313,110 | 5/1994 | Watanabe et al. | 327/227 |
| 5,402,009 | 3/1995 | Kiyota | 327/176 |
| 5,461,334 | 10/1995 | Honda | 327/227 |

FOREIGN PATENT DOCUMENTS 402134912  5/1990  Japan ...................................... 327/229

*Primary Examiner*—Timothy P. Callahan
*Assistant Examiner*—My-Trang Nu Ton
*Attorney, Agent, or Firm*—Eugene I. Shkurko

[57] ABSTRACT

A power efficient implementation of a single-pulse generator requiring less chip area and fewer circuit devices.

11 Claims, 2 Drawing Sheets

SIMPLIFIED DIFFERENTIAL SINGLE-SHOT

BACKGROUND OF THE INVENTION

1. Technical Field of the Invention

This invention pertains to electronic circuits. In particular, this invention is directed to a more efficient implementation of a differential single-shot (single pulse generator) circuit, thereby providing a single-shot circuit which requires minimal silicon area and power usage.

2. Background Art

A conventional configuration for a single-shot generator is illustrated in FIG. 1, which requires several devices and delay lines. The present implementation of a single-shot pulse generator uses fewer devices, less power, and is more area efficient.

It is an object of the invention to provide a power efficient, and space efficient single-pulse generator.

It is another object of the invention to provide a single-shot generator using fewer devices than conventional configurations.

SUMMARY OF THE INVENTION

A single-shot pulse generator fed by a precision current source through a transistor which mirrors the current to a pair of transistors which, in turn, are coupled to a pair of nodes. The nodes are coupled to a pair of signal receiving transistors and to AND gate inputs, which AND gate outputs a pulse in response to a transition of the inputs signals. The pulse width is controlled by discharging capacitors coupled to the AND gate inputs.

Other features and advantages of this invention will become apparent from the following detailed description of the presently preferred embodiment of the invention, taken in conjunction with the accompanying drawings.

BEST MODE FOR CARRYING OUT THE INVENTION

Figure 2A:
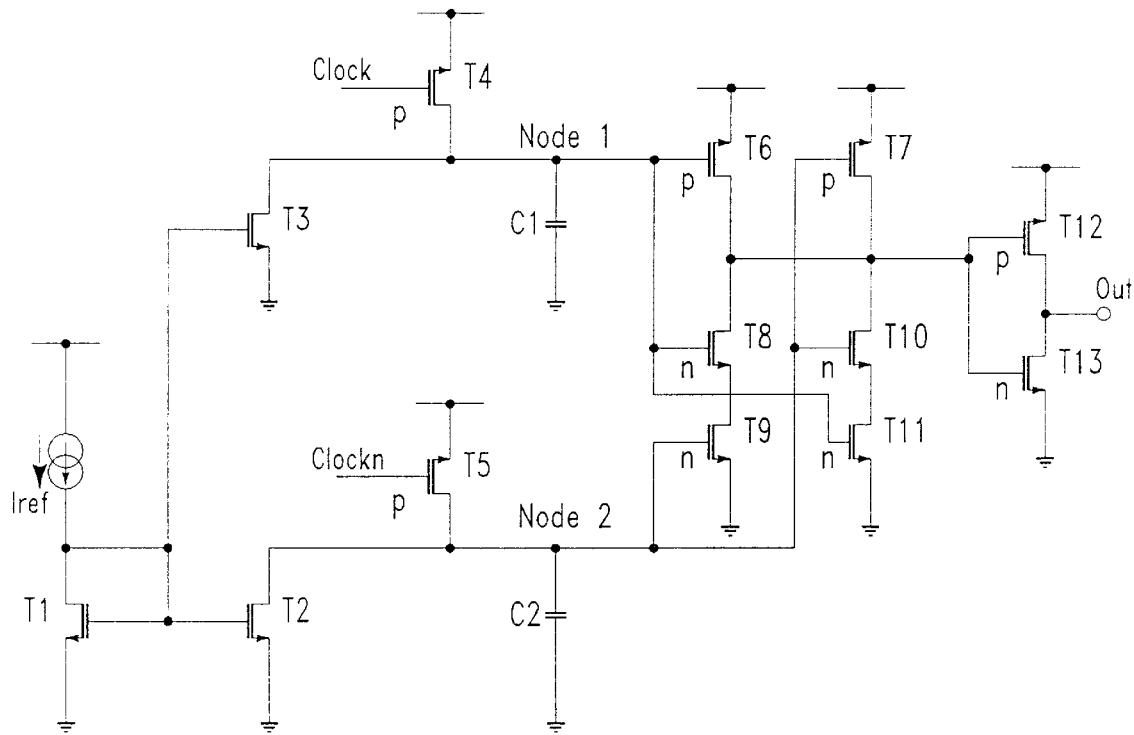
FIGS. 2A–B illustrate the efficient single-shot circuit of the present invention.
Figure 2B:
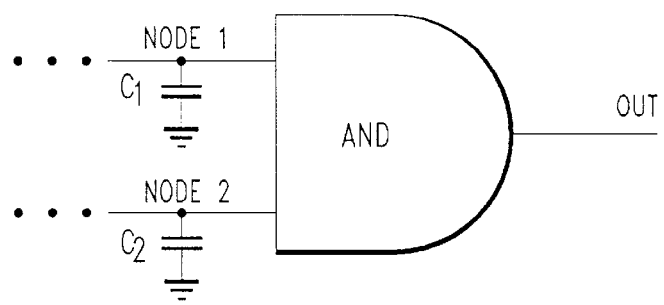

Referring to FIG. 2A, a current reference is coupled to a node comprising the drain of transistor T1 and the gates of transistors T1, T2, and T3. The sources of transistors T1, T2, and T3 are each coupled to ground, though a negative voltage supply terminal would also work well. The drains of transistors T3 and T2 are each coupled to a separate node, nodes 1 and 2, respectively. Also coupled to nodes 1 and 2 are the drains of transistors T4 and T5, respectively, whose sources are coupled to a voltage supply terminal. The gates of transistors T4 and T5 receive differential clock signals Clock and Clockn, respectively, generated by a data latch, for example. Coupled to nodes 1 and 2 are capacitors C1 and C2, respectively, which are also coupled to a voltage sink (i.e. ground or a negative voltage supply as above). Nodes 1 and 2 are also coupled to inputs of an AND gate formed by transistors T6 through T13 (equivalent circuit shown in FIG. 2B), whose output supplies the single-shot pulse.

Figure 1:
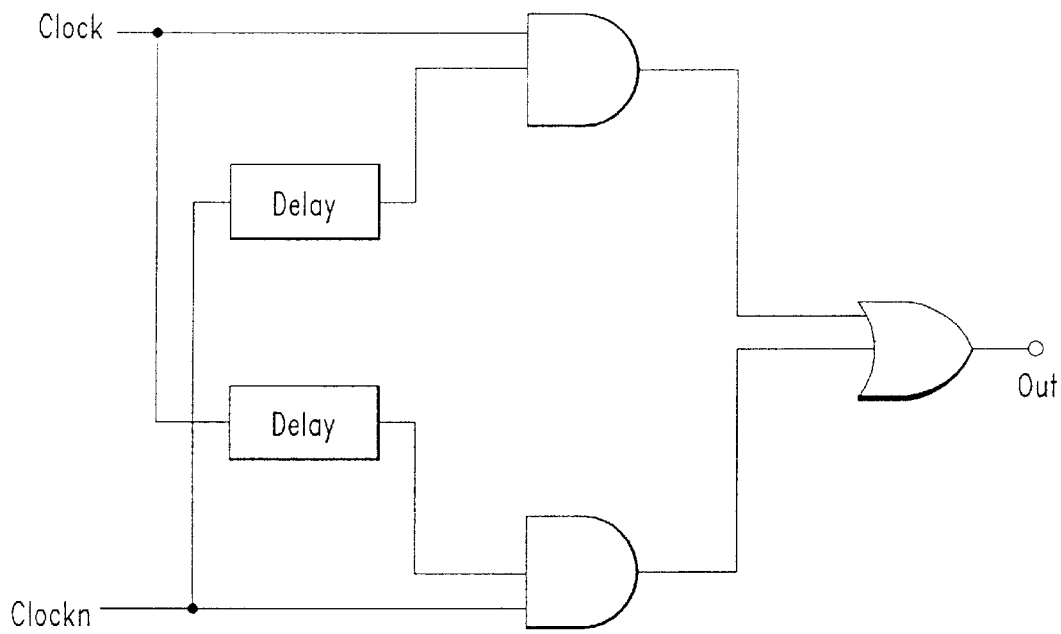
FIG. 1 illustrates a conventional single-pulse generator.
Figure 3:
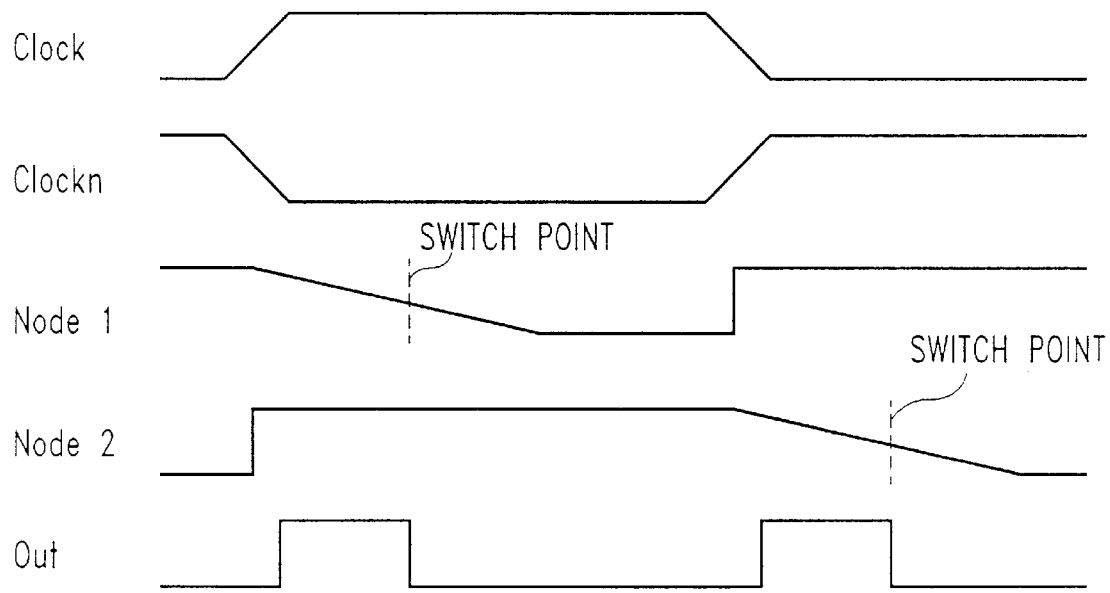
FIG. 3 illustrates the timing relationships of the circuit of FIG. 2.

The input current Iref is mirrored by transistor T1 to transistors T2 and T3. Transistors T4 and T5 are sized such that they can provide many times (approximately 5–10 times or so) the reference current Iref when turned on. Signals Clock and Clockn are the true and compliment of the input signals. At the start of a cycle, Clock is low and Clockn is high (refer to FIG. 3). Node 1 is high and Node 2 is low. When the inputs (Clock and Clockn) switch, Node 2 rises immediately as T5 is turned on. T4 is turned off, and C1 begins to discharge slowly at a constant rate through T3. When Node 2 rises, the output rises (after a small gate delay) and will stay high until Node 1 falls through the switch point of the AND circuit formed by T6–T13 (AND gate will output a "1" only when nodes 1 and 2 are at a high voltage, i.e. both inputting a "1"; and will output a "0" when either node is at a low voltage, i.e. inputting a "0"). Similar behavior occurs when the inputs again switch states, as shown in FIG. 3. Thus, a pulse is output at every polarity switch or transition of the Clock/Clockn inputs and a discharge rate of the capacitors, C1 and C2, controls the width of the output pulse (larger capacitors also providing a longer output pulse), which discharge rate is controlled, in turn, by the reference current controlling transistors T3 and T2, respectively. The width of the pulse is self-generated and is independent of the width or amplitude of the input Clock/Clockn signals (which signals can be seen from FIG. 3 to be much longer than the output pulse). Precision reference currents supplied by analog circuits are preferable for this implementation, however, the implementation described herein is workable with most current sources.

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

What is claimed is:

1. Apparatus comprising:
    means for receiving a reference current;
    a plurality of current mirror means coupled to the receiving means for mirroring the reference current;
    a plurality of signal receiving means each coupled to one of the mirror means and to one of a plurality of signal lines for receiving data signals;
    output means coupled to the plurality of signal receiving means for outputting a pulse in response to the data signals; and
    a plurality of capacitor means each coupled to one of the signal receiving means and to ground for controlling a width of the pulse.

2. The apparatus of claim 1, wherein the output means is coupled to each of the plurality of mirror means each in parallel with one of the signal receiving means.

3. The apparatus of claim 2, wherein the output means is coupled to each of the plurality of capacitor means each in parallel with one of the plurality of signal receiving means.

4. The apparatus of claim 3, wherein the output means comprises an AND gate.

5. The apparatus of claim 3, wherein the output means consists of an AND gate.

6. The apparatus of claim 3, wherein the plurality of capacitor means each consists of a capacitor coupled to a voltage sink, and in parallel to the output means, one of the signal receiving means, and one of the mirror means.

7. The apparatus of claim 3, wherein the plurality of signal receiving means each consists of a transistor coupled to a supply terminal and to one of the plurality of signal lines, and in parallel to the output means, one of the capacitor means, and one of the mirror means.

8. The apparatus of claim 3, wherein the plurality of mirror means comprises:

an input transistor coupled to a current source;

a first mirror transistor coupled to a drain and a gate of the input transistor; and a second mirror transistor coupled to the drain and the gate of the input transistor.

9. The apparatus of claim 8, wherein the first mirror transistor and the second mirror transistor are each further coupled in parallel to one of the signal receiving means, one of the capacitor means, and to the output means.

10. A single-shot circuit comprising:

only one logic gate for outputting a pulse, the logic gate including logic gate inputs each coupled directly to only one of a plurality of input nodes;

only one current source supplying a reference current to the input nodes for controlling a discharge rate of each of the input nodes;

a pair of signal inputs for receiving complimentary signals, the signal inputs coupled to the logic gate inputs such that the logic gate outputs a pulse at each polarity switch of the complimentary signals; and a pair of capacitors each coupled to around and to only one of the input nodes for controlling a width of the pulse by discharging at said discharge rate.

11. A method of producing a single pulse in response to a polarity transition of a data signal, comprising the steps of:

(a) providing a compliment of the data signal simultaneously with the data signal;

(b) inputting the data signal and the compliment of the data signal to inputs of an AND gate simultaneously, a first input of the AND gate receiving a high voltage signal ("1") and a second input of the AND gate receiving a low voltage signal ("0") prior to a simultaneous polarity transition of the data signal and its compliment;

(c) sustaining momentarily the high voltage signal ("1") at the first input of the AND gate, after the simultaneous polarity transition of the data signal and its compliment arrive simultaneously at the inputs of the AND gate, to match a newly transitioned high voltage signal ("1") at the second input of the AND gate to trigger a pulse at an AND gate output; and (d) selecting a size of a capacitor, including coupling the capacitor to ground and to the first input of the AND gate to control a length of the pulse at the AND gate output.

* * * * *